United States Patent [19]

Passlack

[11] Patent Number: 5,665,658
[45] Date of Patent: Sep. 9, 1997

[54] METHOD OF FORMING A DIELECTRIC LAYER STRUCTURE

[75] Inventor: Matthias Passlack, Chandler, Ariz.

[73] Assignee: Motorola, Schaumburg, Ill.

[21] Appl. No.: 620,688

[22] Filed: Mar. 21, 1996

[51] Int. Cl.⁶ .................................. H01L 21/02
[52] U.S. Cl. ............................ 438/763; 438/779
[58] Field of Search ........................ 437/225, 236, 437/235, 237

[56] References Cited

U.S. PATENT DOCUMENTS

| | | | |
|---|---|---|---|
| 4,297,176 | 10/1981 | Hannah et al. | 204/37 R |
| 5,451,548 | 9/1995 | Hunt et al. | 437/225 |
| 5,550,089 | 8/1996 | Dutta et al. | 437/225 |

Primary Examiner—Charles L. Bowers, Jr.
Assistant Examiner—Vanessa Acosta
Attorney, Agent, or Firm—Eugene A. Parsons

[57] ABSTRACT

A method of forming a stable semiconductor device on an at least partially completed semiconductor device including a supporting semiconductor structure of III–V material having a clean and atomically ordered surface to be coated with a dielectric layer structure. A relatively thin layer of $Ga_2O_3$ is deposited on the surface by evaporation using a high purity single crystal of material including $Ga_2O_3$ and a second oxide, such as MgO or $Gd_2O_3$. A second layer of material with low bulk trap density relative to the $Ga_2O_3$ is deposited on the layer of $Ga_2O_3$ to complete the dielectric layer structure.

23 Claims, 2 Drawing Sheets

METHOD OF FORMING A DIELECTRIC LAYER STRUCTURE

FIELD OF THE INVENTION

The present invention pertains to methods of forming dielectric layers on supporting semiconductor structures and more particularly to methods of forming dielectric layers with significantly lower defect density.

BACKGROUND OF THE INVENTION

In the semiconductor art it is often desirable to form dielectric layers or films on various supporting structures, such as the gate insulator in field effect transistors, an insulator or passivation layer covering various areas (e.g. the extrinsic base region) of other types of transistors, such as HBTs and the like, an insulator or passivation layer surrounding the mesa or walls of a vertical cavity surface emitting laser or edge emitting lasers, etc. Regardless of the use, it is generally imperative that the dielectric layer or film be a good insulator with low defect density to enable device operation and enhance/maintain device performance. Also, the thickness of the layer must be sufficient to provide the required characteristics of the semiconductor devices, e.g. leakage current, reliability, etc.

Due to a lack of insulating layers on gallium arsenide (GaAs) based semiconductors providing low interface state density and stable device operation, the performance, integration level and marketability of both digital and analog GaAs based devices and circuits is significantly limited. As is known in the art, growing oxide films by oxidizing GaAs based materials results in high interface state density and a Fermi level which is pinned at the GaAs-oxide interface.

A method of forming a thin film of $Ga_2O_3$ is disclosed in U.S. Pat. No. 5,451,548, entitled "Electron Beam Deposition of Gallium Oxide Thin Films Using A Single Purity Crystal Source", issued Sep. 19, 1995. Basically, this method consists of forming the thin film of $Ga_2O_3$ from the electron beam evaporation of a single crystal of $Gd_3Ga_5O_{12}$. The $Gd_3Ga_5O_{12}$ decomposes into $Gd_2O_3$ (gadolinium oxide) and $Ga_2O_3$ (gallium oxide) during evaporation. The major problem is that some of the $Gd_2O_3$ (about 0.1% according to the patent) is incorporated into the thin film as impurities creating defects and increasing the bulk trap density. The increased defect and, in turn increased bulk trap density degrades the performance of the devices in which the thin film is used. Further, the density of impurities significantly increases as the thickness of the thin film is increased.

Accordingly, it would be highly desirable to provide a method of fabricating dielectric layer structures with significantly reduced defect densities and, consequently, reduced bulk trap densities.

It is a purpose of the present invention to provide a new and improved method of fabricating dielectric layer structures.

It is another purpose of the present invention to provide a new and improved method of fabricating dielectric layer structures having substantially reduced defect and bulk trap densities.

It is a further purpose of the present invention to provide a new and improved method of fabricating dielectric layer structures which result in stable semiconductor device performance.

SUMMARY OF THE INVENTION

The above problems and others are at least partially solved and the above purposes and others are realized in a method of forming a dielectric layer structure on a supporting semiconductor structure including the steps of providing a supporting semiconductor structure of III–V material having a surface to be coated with the dielectric layer structure, depositing a layer of $Ga_2O_3$ on the surface of the supporting structure, and depositing a layer of materials with low bulk trap density relative to the $Ga_2O_3$ on the layer of $Ga_2O_3$ to form the dielectric layer structure.

In a preferred embodiment the layer of $Ga_2O_3$ has a thickness in a range of approximately 0.5 nm to 10 nm and the layer of material with low bulk trap density has a thickness in a range of approximately 2 nm to 1000 nm. Also, the layer of material with low bulk trap density is, for example, $Si_3N_4$. Semiconductor structures formed in this fashion are, for example, GaAs based semiconductors and may include metal-oxide field effect transistors, HBTs, and semiconductor lasers, etc.

BRIEF DESCRIPTION OF THE DRAWINGS

Referring to the drawings.

DESCRIPTION OF THE PREFERRED EMBODIMENT

Figure 1:
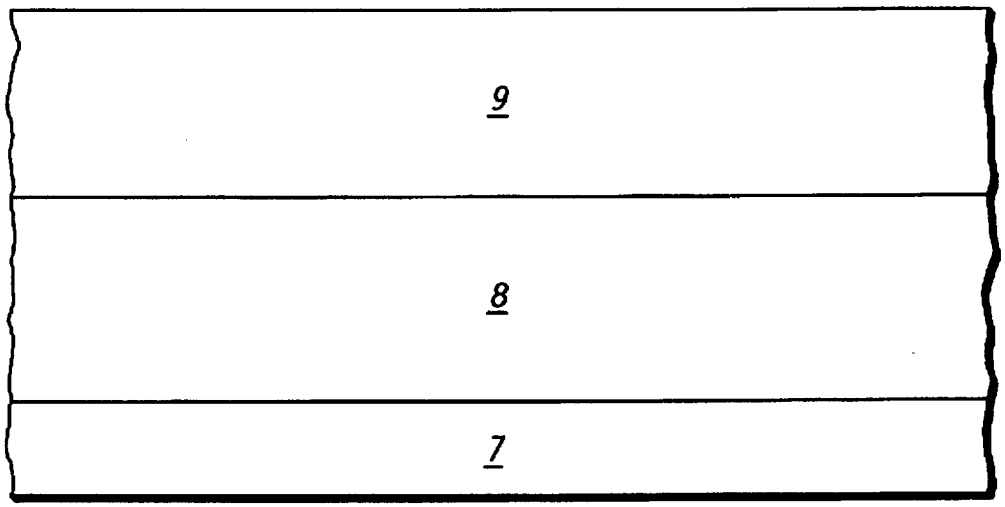
FIG. 1 is a simplified sectional view of a partial semiconductor structure with a dielectric layer structure deposited thereon in accordance with the present invention.

Referring specifically to FIG. 1 a simplified sectional view of a partial semiconductor structure is illustrated with a dielectric layer structure deposited thereon in accordance with the present invention. The partial semiconductor structure includes a supporting semiconductor structure 7, illustrated for simplicity as a single layer. Basically, structure 7 includes any semiconductor substrate, epilayers, or combinations thereof having a surface to be coated with the dielectric layer structure. In general, the substrate is GaAs or GaAs based material (III–V material) and the epilayers are GaAs based material epitaxially grown on the substrate in any of the well known processes.

The dielectric layer structure includes a first layer, or layers, 8 formed on the surface of supporting semiconductor structure 7 and a second layer, or layers, 9 formed on layer 8. As will be explained presently, layer 8 is formed by depositing a layer of $Ga_2O_3$ on the surface of supporting semiconductor structure 7. Basically, layer 8 provides low interface state density on the GaAs based supporting semiconductor structure 7. A layer of material (layer 9) with low bulk trap density relative to the $Ga_2O_3$ is then deposited on the layer of $Ga_2O_3$ to form the dielectric layer structure.

The dielectric layer structure may be formed at any convenient time during the fabrication process and may, for example, be formed in situ in the growth chamber after the epitaxial growth of any or all layers included in structure 7. Layer 8 is formed by providing a high purity single crystal source of a specifically chosen material and evaporating the source by one of thermal evaporation, electron beam evaporation, and laser ablation. One method that can be used consists of forming the layer 8 of $Ga_2O_3$ from the electron beam evaporation of a single crystal of $Gd_2Ga_5O_{12}$. A method of forming a thin film of $Ga_2O_3$ is disclosed in U.S. Pat. No. 5,451,548, entitled "Electron Beam Deposition of Gallium Oxide Thin Films Using A Single Purity Crystal Source", issued Sep. 19, 1995 The $Gd_2Ga_5O_{12}$ decomposes into $Gd_2O_3$ (gadolinium oxide) and $Ga_2O_3$ (gallium oxide) during evaporation. In general, $Ga_2O_3$ layers of this type are formed on supporting semiconductor structure 7 by fabricating low interface state density (low $10^{10}$ cm$^{-2}$eV$^{-1}$ range) insulator GaAs structures using in situ deposition of $Ga_2O_3$ films on clean, molecular-beam grown (100) GaAs surfaces using a multiple chamber ultra-high vacuum system, at substrate temperatures ranging from 0° C. to 620° C.

In a preferred method a high purity single crystal source of $MgGa_2O_4$ containing MgO and $Ga_2O_3$ is used. The melting point of MgO is 2826° C. to 2852° C. Thus, the melting point of MgO is more than 1100° C above the sublimation temperature of $Ga_2O_3$. During heating, $MgGa_2O_4$ decomposes into MgO and $Ga_2O_3$. The $Ga_2O_3$ is slowly released eliminating splattering of the source material on the semiconductor structure. While MgO is an undesired by-product of the decrepitation process, the much higher boiling point (or melting point) results in a significantly lower vapor pressure of the MgO. This in turn results in drastically reduced incorporation of the undesired specie in the oxide film, especially at the dielectric-semiconductor interface, and in significantly lower bulk trap density in the oxide film.

While $MgGa_2O_4$ is a preferred source material, many other materials, including the gallates $BeGa_4O_7$, $Ca_3Ga_2O_6$ ($CaGa_2O_4$, $CaGa_4O_7$), and $SrGa_2O_4$, ($Sr_7Ga_4O_{13}$, $Sr_3Ga_2O_6$, $SrGa_4O_7$, $SrGa_{12}O_{19}$) are potential replacements. Each of the listed gallates decomposes into $Ga_2O_3$ and BeO, CaO, or SrO. The melting points of the second oxides is: BeO is 2530° C., CaO is 2614° C., and SrO is 2430° C. Thus, each of theses oxides has a much higher melting point (greater than 700° C. above the sublimation temperature of the $Ga_2O_3$) resulting in a significantly lower vapor pressure and reduced impurities in the oxide film. For further details in the formation of the $Ga_2O_3$ layer refer to a copending United States Patent Application entitled "Method of Forming a Dielectric Layer", attorney docket number CR96-033, filed of even date herewith and assigned to the same assignee.

However, when the dielectric layer structure is formed only of a $Ga_2O_3$ layer the bulk trap density can become significant, especially as the thickness of the dielectric layer structure becomes greater (e.g. 20 nm to 50 nm). To overcome this problem, layer 8 is formed with a thickness in the range of 0.5 nm to 10 nm. Generally, the minimum thickness of layer 8 is determined by thermodynamic stability requirements of the entire structure. The allowable maximum thickness of layer 8 is determined by bulk trap distribution and density as well as semiconductor device performance requirements.

As previously mentioned, layer 9 is then deposited on layer 8 to complete the dielectric layer structure. Layer 9 is formed of material with low bulk trap density relative to the $Ga_2O_3$. The minimum thickness of layer 9 is determined by semiconductor device performance requirements and the maximum thickness of layer 9 is governed by trapping processes in layer 8 and by trapping processes at the interface between layers 8 and 9. In general, the thickness of layer 9 is in a range of approximately 2 nm to 1000 nm. As a specific example, layer 9 includes a layer, or layers, of $Si_3N_4$ formed by jet vapor deposition. For more details on jet vapor deposition see: U.S. Pat. No. 4,788,082 entitled "Method and Apparatus for the Deposition of Solid Films of a Material From a Jet Stream Entraining the Gaseous Phase of Said Material", issued Nov. 29, 1988; U.S. Pat. No. 5,256,205 entitled "Microwave Plasma Assisted Supersonic Gas Jet Deposition of Thin Film Materials", issued Oct. 26, 1993; U.S. Pat. No 5,356,672 entitled "Method for Microwave Plasma Assisted Supersonic Gas Jet Deposition of Thin Films", issued Oct. 18, 1994; and U.S. Pat. No. 5,356,673 entitled "Evaporation System and Method for Gas Jet Deposition of Thin Film Materials", issued Oct. 18, 1994. Both layers 8 and 9 are of amorphous phase.

Figure 2:
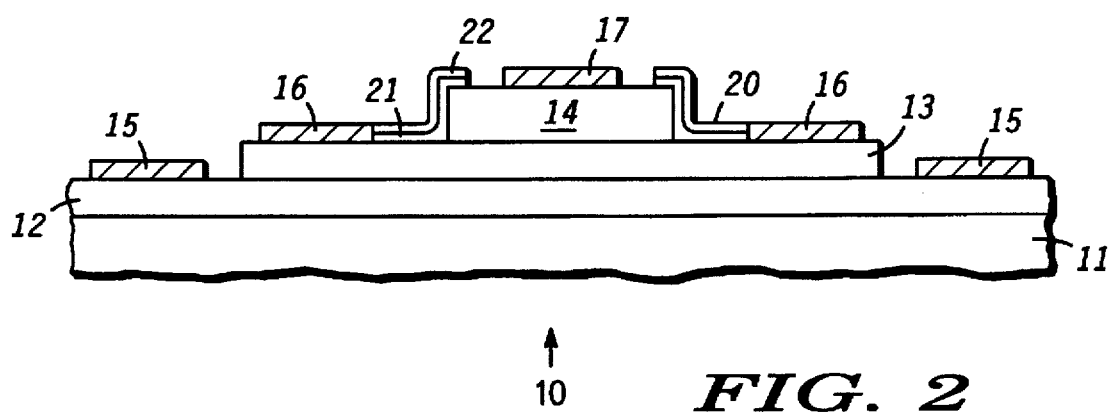
FIG. 2 is a simplified cross-sectional view of an HBT incorporating the present invention.

Several specific examples of semiconductor devices incorporating the novel dielectric layer structure are illustrated in FIGS. 2–5. Referring specifically to FIG. 2 a simplified cross-sectional view of a heterojunction bipolar transistor (HBT) 10 incorporating the present invention is illustrated. In this simplified form, HBT 10 includes a substrate 11, a collector layer 12 formed (grown or otherwise deposited) on the upper surface of substrate 11, a base layer 13 formed on the upper surface of collector layer 12 and an emitter layer 14 formed on the upper surface of base layer 13. Collector contact or contacts 15 are deposited on an upper surface of collector layer 12. Base contact or contacts 16 are deposited on an upper surface of base layer 13. An emitter contact 17 is deposited on an upper surface of emitter layer 14. All of the various layers and contacts are formed in a well known manner and may be formed in any sequence convenient to the specific device and fabrication technique being utilized.

In general, substrate 11 is a III-V material such as gallium arsenide and all of the materials used in layers 12, 13 and 14 are in a similar material system so as to be crystalographically coupled. This is accomplished, as is known in the art, by epitaxially growing the various layers in sequence in a standard growth chamber.

A dielectric layer structure 20 is formed over exposed portions of emitter layer 14 and base layer 13 for purposes of passivation and to enhance device performance and stability. As explained above, dielectric layer structure 20 may be formed at any convenient time during the fabrication process following removal of native oxide under ultra-high vacuum conditions. A first layer 21 of dielectric layer structure 20 is formed by providing a high purity single crystal source of a specifically chosen material and evaporating the source by one of thermal evaporation, electron beam evaporation, and laser ablation. The single crystal source is composed of $Ga_2O_3$ and a second oxide such as $Gd_2O_3$, MgO, etc. A second layer 22, formed of material with low bulk trap density relative to the $Ga_2O_3$, is deposited on layer 21. Dielectric layer structure 20 is generally formed with a thickness greater than 20 angstroms and preferably in a range of approximately 20 angstroms to 50 angstroms.

Figure 3:
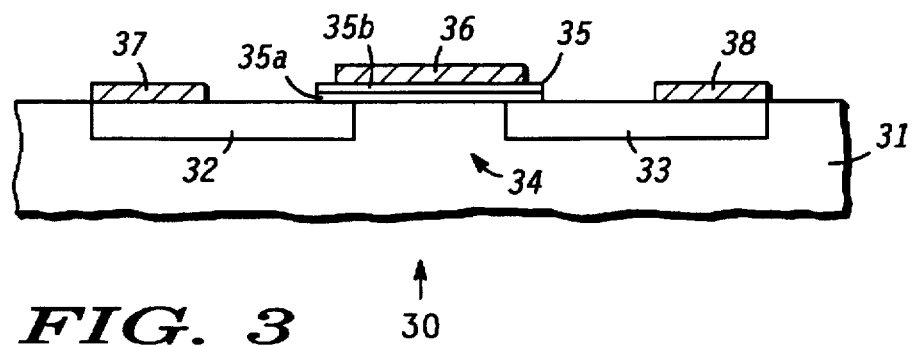
FIG. 3 is a simplified cross-sectional view of a metal-oxide semiconductor FET incorporating the present invention.

Referring now to FIG. 3, a simplified cross-sectional view of a semiconductor FET 30 is illustrated. FET 30 includes a substrate 31 having heavily doped source and drain areas 32 and 33, respectively, formed therein with a channel area 34 therebetween. Substrate 31 is a GaAs based material (III-V material). A dielectric layer structure 35 (generally referred to as a gate oxide) is deposited over channel area 34 in accordance with the present invention. Dielectric layer structure 35 includes a first layer 35a of $Ga_2O_3$ and a second layer 35b of material with low bulk trap density relative to the $Ga_2O_3$. A gate metal contact 36 is deposited on dielectric layer structure 35 in a usual procedure and source and drain contacts 37 and 38 are deposited on source and drain areas 32 and 33, respectively.

Figure 4:
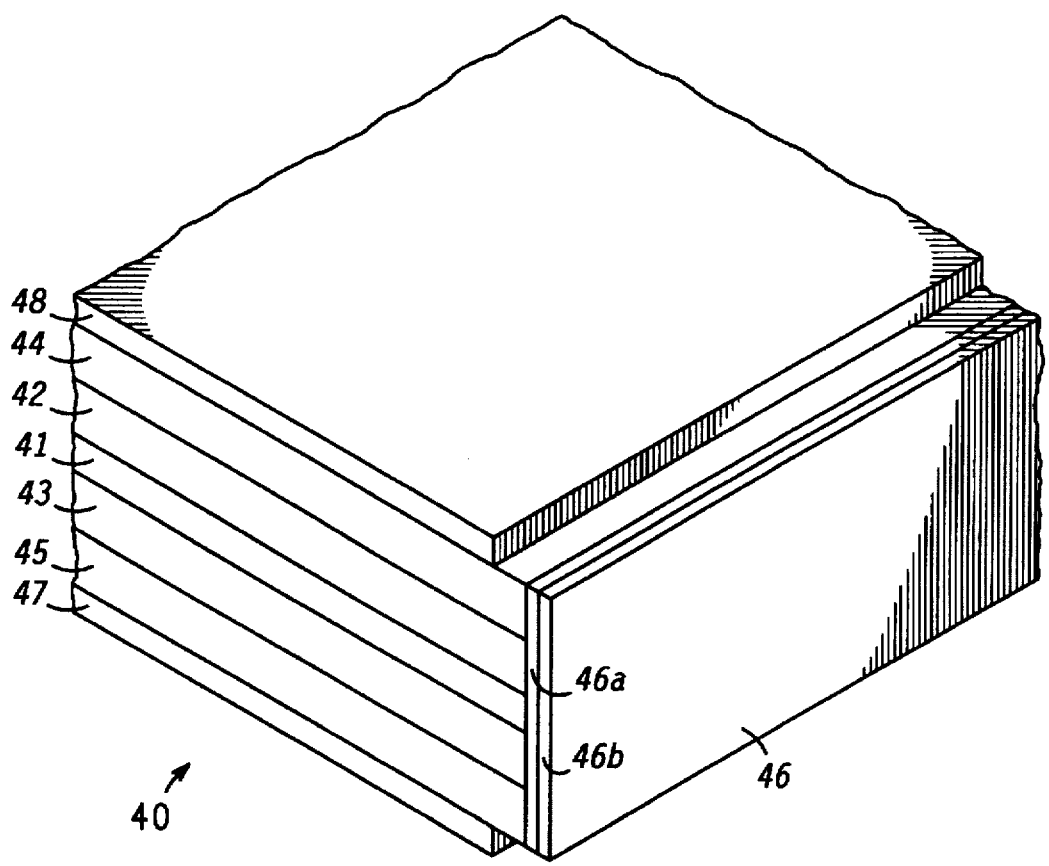
FIG. 4 is a simplified isometric view of a semiconductor laser incorporating the present invention.

Referring now to FIG. 4, a simplified isometric view of a semiconductor laser 40 is illustrated. In this embodiment, an active layer 41 containing at least one quantum well is sandwiched between optical confinement layers 42 and 43, which are in turn sandwiched between cladding layers 44 and 45. Strictly for illustrative purposes a dielectric layer structure 46 is deposited over a light emitting facet of the structure. Dielectric layer structure 46 includes a first layer 46a of $Ga_2O_3$ and a second layer 46b of material with low bulk trap density relative to the $Ga_2O_3$, formed in accordance with the present invention. Ohmic contacts 48 and 47 are deposited on the outer surfaces of cladding layers 44 and 45, respectively to provide power to the structure. As is well known in the art, layers 41–45 of various types of lasers are formed of GaAs based material (a III–V material).

Figure 5:
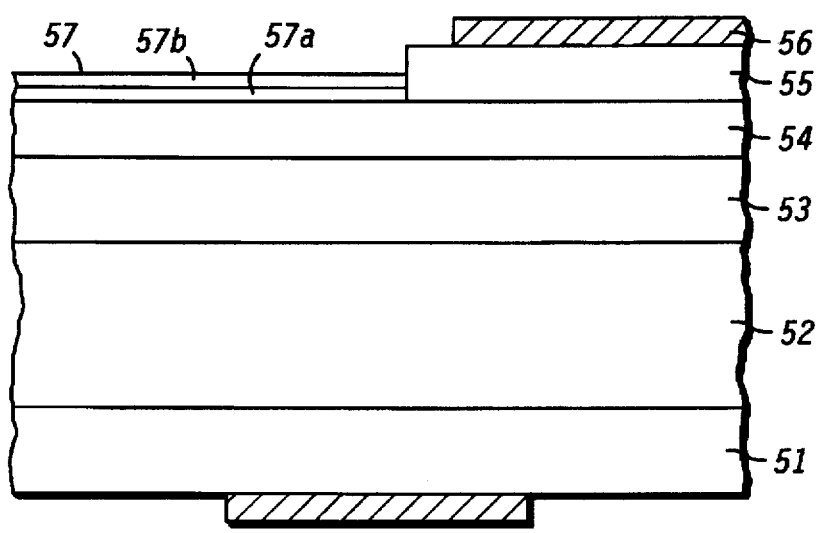
FIG. 5 is a simplified cross-sectional view of a light receiving semiconductor device incorporating the present invention.

Referring now to FIG. 5, a simplified cross-sectional view of a light receiving semiconductor device 50 incorporating the present invention is illustrated. Device 50 is basically a light sensitive P-N junction including a GaAs substrate 51 with $N^+$ doping and an ohmic contact on the lower surface. A drift region 52 is formed of a layer of GaAs with $N^-$ doping. A GaAs layer 53 with $P^+$ doping is formed on the surface of drift region 52 and a contact layer 54 of AlGaAs with $P^+$ doping is formed on the surface thereof. A GaAs layer 55 with $P^+$ doping partially covers layer 54 and has an ohmic contact 56 thereon. The remainder of layer 54 is covered with a dielectric layer structure 57, formed in accordance with the present invention, and defines a light receiving surface. Dielectric layer structure 57 includes a first layer 57a of $Ga_2O_3$ and a second layer 57b of material with low bulk trap density relative to the $Ga_2O_3$, formed in accordance with the present invention.

Thus, a new and improved method of forming a dielectric layer on III–V based materials, and specifically GaAs based materials, is disclosed. The improved process results in oxide films incorporating significantly lower impurities and trap density. The significantly lower trap densities result in the fabrication of stable, high performance semiconductor devices.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of forming a dielectric layer structure on a supporting semiconductor structure comprising the steps of:

providing a supporting semiconductor structure of III–V material having a surface to be coated with the dielectric layer structure;

depositing a layer of $Ga_2O_3$ on the surface of the supporting structure; and depositing a layer of material with low bulk trap density relative to the $Ga_2O_3$ on the layer of $Ga_2O_3$ to form the dielectric layer structure.

2. A method of forming a dielectric layer structure on a supporting semiconductor structure as claimed in claim 1 wherein the step of depositing the layer of $Ga_2O_3$ includes depositing the layer of $Ga_2O_3$ by evaporation using a high purity single crystal $NgGa_2O_4$ source at substrate temperatures ranging from 0° C. to 620° C.

3. A method of forming a dielectric layer structure on a supporting semiconductor structure as claimed in claim 2 wherein the step of depositing a layer of $Ga_2O_3$ on the surface of the supporting semiconductor structure by evaporation includes one of thermal evaporation, electron beam evaporation, and laser ablation.

4. A method of forming a dielectric layer structure on a supporting semiconductor structure as claimed in claim 1 wherein the layer of $Ga_2O_3$ is formed to a thickness in a range of approximately 0.5 nm to 10 nm.

5. A method of forming a dielectric layer structure on a supporting semiconductor structure as claimed in claim 1 wherein the layer of material with low bulk trap density is formed to a thickness in a range of approximately 2 nm to 1000 nm.

6. A method of forming a dielectric layer structure on a supporting semiconductor structure as claimed in claim 1 wherein the layer of material with low bulk trap density is formed of $Si_3N_4$.

7. A method of forming a dielectric layer structure on a supporting semiconductor structure as claimed in claim 6 wherein the layer of $Si_3N_4$ is formed by jet vapor deposition.

8. A method of forming a dielectric layer structure on a supporting semiconductor structure as claimed in claim 1 wherein the step of providing a supporting semiconductor structure includes providing a GaAs based semiconductor.

9. A method of forming a dielectric layer structure on a supporting semiconductor structure comprising the steps of:

providing a supporting semiconductor structure of III–V material having a surface to be coated with a dielectric layer;

depositing a layer of $Ga_2O_3$, having a sublimation temperature, on the surface of the supporting semiconductor structure by evaporation using a high purity single crystal of material including $Ga_2O_3$ and a second oxide with a melting point greater than 700° C. above the sublimation temperature of the $Ga_2O_3$; and depositing a layer of material with low bulk trap density relative to the $Ga_2O_3$ on the layer of $Ga_2O_3$ to form the dielectric layer structure.

10. A method of forming a dielectric layer structure on a supporting semiconductor structure as claimed in claim 9 wherein the step of depositing, the high purity single crystal of material is performed at substrate temperatures ranging from 0° C. to 620° C.

11. A method of forming a dielectric layer structure on a supporting semiconductor structure as claimed in claim 9 where, in the step of depositing, the high purity single crystal of material the second oxide preferably has a melting point greater than 800° C. above the sublimation temperature of the $Ga_2O_3$.

12. A method of forming a dielectric layer structure on a supporting semiconductor structure as claimed in claim 9 wherein the layer of $Ga_2O_3$ is formed to a thickness in a range of approximately 0.5 nm to 10 nm.

13. A method of forming a dielectric layer structure on a supporting semiconductor structure as claimed in claim 9 wherein the layer of material with low bulk trap density is formed to a thickness in a range of approximately 2 nm to 1000 nm.

14. A method of forming a dielectric layer structure on a supporting semiconductor structure as claimed in claim 9 wherein the layer of material with low bulk trap density is formed of $Si_3N_4$.

15. A method of forming a dielectric layer structure on a supporting semiconductor structure as claimed in claim 14 wherein the layer of $Si_3N_4$ is formed by jet vapor deposition.

16. A method of forming a dielectric layer structure on a supporting semiconductor structure as claimed in claim 9 wherein the step of depositing a layer of $Ga_2O_3$ on the surface of the supporting structure by evaporation includes one of thermal evaporation, electron beam evaporation, and laser ablation.

17. A method of forming a dielectric layer structure on a supporting semiconductor structure as claimed in claim 9 wherein the step of providing a supporting structure includes providing a GaAs based semiconductor.

18. A method of forming a stable semiconductor device comprising the steps of:

providing an at least partially completed semiconductor device including a supporting semiconductor structure of III–V material having a surface to be coated with a dielectric layer structure;

depositing a layer of $Ga_2O_3$, having a sublimation temperature, on the surface of the supporting structure by evaporation using a high purity single crystal of material including $Ga_2O_3$ and a second oxide with a melting point greater than 700° C. above the sublimation temperature of the $Ga_2O_3$; and depositing a layer of material with low bulk trap density relative to the $Ga_2O_3$ on the layer of $Ga_2O_3$ to form the dielectric layer structure.

19. A method of forming a stable semiconductor device as claimed in claim 18 wherein the step of providing the at least partially completed semiconductor device includes providing one of a metal-oxide field effect transistor, an HBT, and a semiconductor laser.

20. A method of forming a stable semiconductor device as claimed in claim 18 wherein the layer of $Ga_2O_3$ is formed to a thickness in a range of approximately 0.5 nm to 10 nm.

21. A method of forming a stable semiconductor device as claimed in claim 18 wherein the layer of material with low bulk trap density is formed to a thickness in a range of approximately 2 nm to 1000 nm.

22. A method of forming a stable semiconductor device as claimed in claim 18 wherein the layer of material with low bulk trap density is formed of $Si_3N_4$.

23. A method of forming a stable semiconductor device as claimed in claim 22 wherein the layer of $Si_3N_4$ is formed by jet vapor deposition.

* * * * *

UNITED STATES PATENT AND TRADEMARK OFFICE
CERTIFICATE OF CORRECTION

PATENT NO. : 5,665,658
DATED : September 9, 1997
INVENTOR(S) : Matthias Passlack It is certified that error appears in the above-indentified patent and that said Letters Patent is hereby corrected as shown below:

In Claim 1, column 5, line 51, after "III-V", insert -- (of the periodic table)--.

In Claim 2, column 5, line 63, delete "NgGa$_2$O$_4$" and insert --MgGa$_2$O$_4$--.

In Claim 9, column 6, line 26, after "III-V", insert -- (of the periodic table)--.

In Claim 18, column 7, line 12, after "III-V", insert -- (of the periodic table)--.

Column 2, line 3, after "III-V" insert -- (of the periodic table) --.

Signed and Sealed this

Sixth Day of January, 1998

*Attest:*

BRUCE LEHMAN

*Attesting Officer*     Commissioner of Patents and Trademarks